US007366264B2

(12) United States Patent
Henriksson

(10) Patent No.: US 7,366,264 B2

(45) Date of Patent: Apr. 29, 2008

(54) METHOD AND SYSTEM FOR REDUCING NOISE IN A MULTI-CARRIER SIGNAL

(75) Inventor: Jukka Henriksson, Espoo (FI)

(73) Assignee: Nokia Corporation, Espoo (FI)

(*) Notice: Subject to any disclaimer, the term of this patent is extended or adjusted under 35 U.S.C. 154(b) by 754 days.

(21) Appl. No.: 10/693,033

(22) Filed: Oct. 24, 2003

(65) Prior Publication Data

US 2004/0085891 A1 May 6, 2004

(30) Foreign Application Priority Data

Oct. 30, 2002 (GB) ................................ 0225283.1

(51) Int. Cl.
*H03D 1/04* (2006.01)

(52) U.S. Cl. ...................................... 375/346; 375/351

(58) Field of Classification Search ................ 375/316, 375/254, 324, 340, 346, 350, 278, 285, 351
See application file for complete search history.

(56) References Cited

U.S. PATENT DOCUMENTS 4,154,980 A * 5/1979 Schmidt et al. ............... 381/13
5,170,489 A * 12/1992 Glazebrook ................ 455/63.1
5,463,662 A * 10/1995 Sutterlin et al. ............ 375/351
5,537,675 A * 7/1996 Bond ......................... 455/223
6,295,324 B1 * 9/2001 Whikehart .................. 375/308
6,347,146 B1 * 2/2002 Short et al. ................... 381/15
6,384,681 B1 * 5/2002 Bonds ........................ 330/149
6,385,261 B1 * 5/2002 Tsuji et al. ................. 375/346
6,420,873 B1 * 7/2002 Guthrie ...................... 324/322
6,473,369 B1 * 10/2002 Quan et al. .............. 369/30.14
2001/0012762 A1 8/2001 Kuchn et al. ................. 455/46
2003/0043925 A1 * 3/2003 Stopler et al. .............. 375/254
2004/0203551 A1 * 10/2004 Li et al. ..................... 455/296

FOREIGN PATENT DOCUMENTS

EP 0930719 A2 7/1999
EP 1043874 A2 10/2000
EP 1128550 A2 8/2001
EP 1180851 A2 2/2002
JP 11355240 A 12/1999

OTHER PUBLICATIONS

"Signal Processing Algorithm for OFDM Channel With Impulse Noise", Sliskovic, Maja, IEEE 2000, pp. 222-225.

* cited by examiner

*Primary Examiner*—Emmanuel Bayard
(74) *Attorney, Agent, or Firm*—Harrington & Smith, PC

(57) ABSTRACT

A receiver 100 for receiving a multi-carrier signal comprises detection means for detecting 801 the presence of impulse interference within the signal and identifying one or more samples of the signal affected by the impulse interference, means for selecting samples to be blanked, means for blanking the selected samples and means 805 for estimating the blanked signal. The selected samples comprise those samples ($l_0$ to $l_0$+k) identified as being affected by impulse interference and at least one of the following: a number of samples $x_1$ preceding the said identified samples ($l_0$ to $l_0$+k) or a number of samples $x_2$ following the said identified samples ($l_0$ to $l_0$+k). The blanking means may define the length of a blanking window 301 to have one of a plurality of different predetermined lengths, using the smallest of the predetermined lengths sufficient to encompass the selected samples.

27 Claims, 7 Drawing Sheets

START 200
A/D convert incoming signal 201
Detect presence of impulse burst 202
Select samples for blanking 203
Select blanking window length and define window 204
Blank selected samples 205
Calculate normal FFT of blanked signal 206
Forward and save result in output buffer 207
END 208

METHOD AND SYSTEM FOR REDUCING NOISE IN A MULTI-CARRIER SIGNAL

FIELD OF THE INVENTION

This invention relates to systems and methods for reducing noise in data received over a communications link.

BACKGROUND OF THE INVENTION

Broadcasting has been successful throughout the world in bringing both entertainment and information to mass audiences. The history of broadcasting began almost a century ago with radio, while the history of TV stretches back to the 1930's.

The latest step in broadcasting is the digitalisation of both radio and TV. Digital radio has not yet gained widespread acceptance on the market. However, many hope that digital TV will bring new benefits and services to the consumer and, as a result, generate new revenue streams for the broadcasting industry. The basic concept of the TV service itself has, however, not changed much. Rather, the TV services continue as before, even where they have become digital.

The later half of 1990's saw a boom in use of the Internet. A whole set of new services and content became available to the consumers during a short, revolutionary and hype intensive period. E-commerce, Internet Service Providers (ISPs), portals, eyeballs game, dotcom companies and even the new economy were introduced during that period. Developments in both access technologies (e.g. ADSL) and coding technologies (e.g. MPEG-2 streaming) have made it possible to bring rich media content, such as video content, into homes via the Internet. In spite of these technology and market breakthroughs, media houses have been reluctant to distribute their content via the Internet due to its "free-of-charge" nature and the direct threat of piracy. Furthermore, despite its great popularity, the Internet has yet to challenge the role of traditional media as the primary advertisement platform.

Impulsive interference is observed to cause difficulties in broadcast reception. This interference may be produced by ignition sparks from vehicles or various household appliances like hair-dryers, vacuum cleaners, drilling machines etc. The cheapest models of these appliances often have insufficient interference suppression. Also, for the same reason, a single pulse, or even a burst of pulses, is produced when switching on or off any device connected to the power line. These could be electrical heating devices, thyristor dimmers, fluorescent lamps, refrigerators etc. The effect of impulsive interference has to be taken into consideration, especially for indoor reception with a simple omnidirectional aerial. The field strength of a broadcast signal, especially for a portable device situated indoors, can be quite low and further weakened by multipath reception. For fixed reception, insufficient cable shielding in inhouse signal distribution means often reduces the benefit of a roof aerial, making the signal reception sensitive to impulsive interference.

A prior approach for reducing the effects of impulsive noise is based on clipping the impulse bursts, in which corrupted signal samples are given the value corresponding to the amplitude of a clipping level, while retaining their phase. Alternatively, the clipped values may be set to a value of zero because the affected samples are known to be unreliable in any case. An example of an approach along these lines is described in patent application EP 1 043 874 A2. However, this approach leaves samples that have been corrupted but not clipped untouched, so that noise-affected samples having amplitudes below the clipping level remain. This leads to a poor signal-to-interference ratio, especially if the burst power is high. Approaches based on clipping do not detect, and therefore cannot remove, impulse noise with signal levels below the clipping level, limiting the capability of these methods.

Another approach for eliminating impulsive noise is to blank all the samples that are known to be corrupted, i.e. those samples belonging to an interference burst period. The knowledge of impulse position and duration may be derived, for example, by monitoring an incoming signal for samples with amplitudes exceeding a predetermined threshold or clipping level. One such approach is presented in Sliskovic, M: Signal processing algorithm for OFDM channel with impulse noise, The 7th IEEE International Conference on Electronics, Circuits and Systems (ICECS 2000), Volume: 1, 2000, Page(s): 222-225 vol. 1, where, in order to improve performance, estimates of the values of the original signal for the blanked samples are derived using information from guard band samples. Unfortunately, this requires the solution of general complex system equations, which is cumbersome. In addition, relying on the spectrum part in the guard band is undesirable in systems where many carriers are received through a noisy channel, as the original values of missing samples cannot be determined reliably. Furthermore, this method does not overcome the problem of identifying corrupted samples having amplitudes below the threshold or clipping level.

Thus, there is a need for a receiver that can withstand high levels of interference and provide high data reception quality that is suitable for receiving a data signal comprising a large number of carriers.

SUMMARY OF THE INVENTION

An object of the invention is to provide a method and arrangement for reducing the effect of impulse interference in a received multi-carrier signal that is transferred over a data link.

According to a first aspect of the invention, a method for receiving a multi-carrier signal comprises the steps of detecting a presence of at least one impulse interference within the signal, identifying one or more samples of said signal where a significant amount of the impulse noise caused by the at least one impulse interference is present, selecting samples to be blanked, blanking the selected samples to obtain a signal with blanking and determining an estimate of the signal with blanking, wherein the selected samples comprise the samples identified to have impulse interference present and at least one of the following: a first predetermined number of samples preceding the identified samples and a second predetermined number of samples following the identified samples.

This aspect also provides a computer program comprising program instructions for performing such a method.

According to a second aspect of the invention, an apparatus comprises a receiver for receiving a multi-carrier signal and a processor, wherein the processor is configured to detect the presence of impulse interference in the signal, identify one or more samples of said signal where a significant amount of the impulse noise is present, select samples of said signal to be blanked, the selected samples including the identified samples and at least one of a first predetermined number of samples preceding the identified samples and a second predetermined number of samples following the identified samples, blank the selected samples to obtain a signal with blanking and determine an estimate of the signal with blanking.

This apparatus may form part of a communication system wherein a multi-carrier signal is transmitted and received.

The inclusion of samples preceding and/or following the affected samples within the interval to be blanked reduces the effects of any uncertainty associated with the detection of samples affected by the impulsive noise peak or burst, such as the determination of the burst position or length. Although this may lead to a number of samples that are unaffected by impulse interference being blanked, this drawback is outweighed by the increased likelihood that all corrupted samples will be eliminated.

A blanking window may be defined, so that all samples within a blanking window are blanked. It is advantageous, but not essential, for the blanking window to be defined to have one of a number of predetermined lengths, where the length selected is the smallest length that encompasses the affected samples and at least one of a first predetermined number of samples preceding the said identified samples or a second predetermined number of samples following the said identified samples.

This modified approach to blanking may allow the correction of relatively long bursts of impulse noise, depending on parameters such as the sensitivity of the incoming signal to interference. Several discontinuous blanking intervals may be used within one symbol, as long as the total length of the blanking does not exceed the capability of the method for the selected transmission mode. The complexity of the scheme and additional energy consumption are low. The method provides greater efficiency in broadcast data reception and combines effectiveness with simplicity.

The effectiveness of the noise reduction procedure does not depend on the burst strength and, while the output signal is degraded to an extent, the data symbol may still be useable. If no impulse noise is present, there is very little to no degradation. The method is fairly robust. Channel noise does not significantly degrade the performance. Also, the method does not require precise channel state information and, hence, can tolerate fairly high Doppler frequencies.

The method is easily and generally applicable and does not rely on information from the guard bands or pilot channels, which may be unreliable.

The receiver detects the presence of impulse interference in the received signal and determines which samples of the signal are affected. In its simplest embodiments, it is not necessary to determine the impulse length. The algorithm requires little or no modification for handling different burst noise scenarios. Required changes to existing chip design are minor and can be easily implemented.

The invention is particularly suited to multi-carrier systems with a large number of carriers, e.g. a hundred or more. For example, an orthogonal frequency division multiplexing (OFDM) system may utilise thousands of carriers. In such a system, it is possible to blank a number of signal samples while causing only limited distortion in a resulting decoded signal.

BRIEF DESCRIPTION OF THE DRAWINGS

The invention will now be described, by way of example only, with reference to the accompanying drawings, in which.

DETAILED DESCRIPTION

An embodiment of the invention provides a method for tolerating impulsive burst noise in OFDM systems, especially using a Terrestrial Digital Video Broadcasting (DVB-T) standard such as Digital Video Broadcasting (DVB): Framing structure, channel coding and modulation for digital terrestrial television, ETSI EN 300 744. Digital Video Broadcasting (DVB) offers a high bandwidth transmission channel wherein delivery is typically multicast or, alternatively, unicast. The high bandwidth transmission channel can offer a user various services. Proper reception of the transmitted broadcast data is necessary in order to access or use the services.

A digital broadcast transmission provides a receiver device with huge amount of data information. The digital broadcast transmission is a streaming distribution typically to multiple receivers or, alternatively, a unicast point-to-point distribution to a single receiver. A data distribution link in the broadcast delivery can be a wireless link, a fixed link, or a wired link. For example, DVB-MHP (Multimedia Home Platform) provides the receiver with multiple data distribution links. The digital broadcast transmission system may interact with the receiver but interaction is not a mandatory requirement. A system with the interaction capabilities can request data having errors to be retransmitted but the broadcast receiver, configured to receive a streaming delivery, should be able to tolerate some errors in data. Therefore, the reception of the digital transmission should be reliable and capable of tolerating a reasonable amount of impulse interference.

Figure 1:
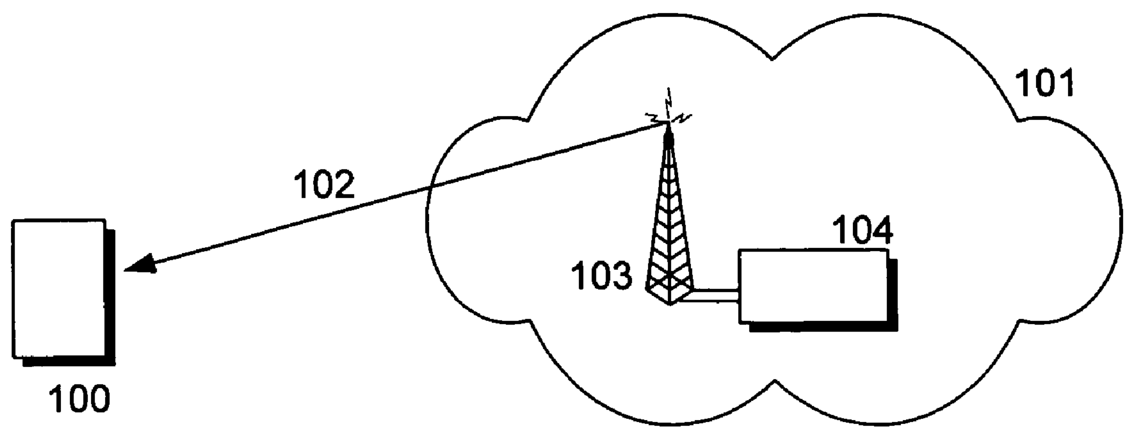
FIG. 1 depicts a system in which the principles of the invention can be applied.

With reference to FIG. 1, a receiver 100 operates under the coverage of a digital broadcast network (DBN) 101. The receiver 100 is capable of receiving Internet Protocol (IP) based services provided by the DBN 101. The transmission over the DBN 101 comprises a transport stream (TS) 102. The DBN 101 comprises means for modifying the transport stream 102 and means for generating and transmitting the signal via transmitter 103. The TS 102 may include both data and reference information, such as boosted pilot values or guard band values, where the receiver 100 is capable of differentiating between data and reference information. The receiver 100 detects impulse interference and blanks affected samples. These procedures can be performed continuously while receiving the service. Advantageously, the receiver 100 does not require any interaction with the transmitter 103, thereby increasing cost efficiency.

The DBN 101 transfers the data to the user over a data link, here a terrestrial digital video broadcast (DVB-T) network. Before the transmission, the data is processed in the DBN 101. As is well known in the art, IP encapsulators 104 perform a multi-protocol encapsulation (MPE) and place the IP data into Moving Picture Experts Group-Transport Stream (MPEG-TS) based data containers. The IP encapsulators 104 generate tables for inclusion in the TS, which provide information about the data, and link or modify these tables as required. Alternatively, a multiplexer may perform these functions. The operation of the IP encapsulators 104 involves placing the received data into User Datagram Protocol (UDP) packets, encapsulated within IP packets, which are in turn encapsulated into DVB packets. Details of this multi-protocol encapsulation technique may be found, for example, in standard document EN 301 192. At the application layer, suitable protocols include Unidirectional Hypertext Transfer Protocol (UHTTP), Real-Time Streaming Protocol (RTSP), Real-time Transport Protocol (RTP), Service Announcement Protocol/Service Description Protocol (SAD/SDP) and File Transfer Protocol (FTP). The DVB packets so produced are transmitted over the DVB data link as is known in the art. Where a transmission rate is specified by the broadcaster, that rate is adhered to.

If required, the IP encapsulation may make use of Internet Protocol Security (IPSEC), as described in Request for Comments 2401, The Internet Society, 1998) to ensure that content can only be used by receivers with the appropriate credentials. During the encapsulation process, a unique identifier may be added to at least one of the headers. For example, when UHTTP is used, the unique identifier may be encoded in the UHTTP header under the Universal Unique Identifier (UUID) field. In order to cater for the delivery of data to a particular receiver or group of receivers, the containers may also hold address information which can be identified and read by a conditional access component in the receiver 100 to determine whether the data is intended for that receiver 100. Alternatively, to cater for the delivery of data to a plurality of receivers, multicast can be applied to allow a single sender to reach multiple receivers. A Virtual Private Network (VPN) can also be formed in the system of the DBN 101 and the receiver 100. A bandwidth portion of the DBN 101 is allocated to a point-to-point or point-to-multipoint communication from the DBN 101 to the receiver 100. The DBN 101 also has various transmission channels for other transport streams. The receiver 100 performs multi-protocol decapsulation to retrieve the IP data packets.

Figure 2:
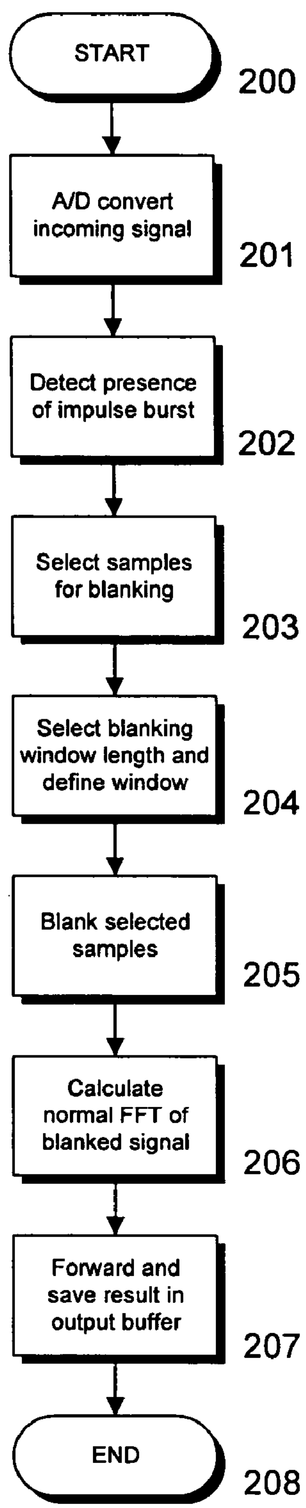
FIG. 2 is a flowchart of a process for reducing the effects of impulse interference in a received signal.

FIG. 2 is a flowchart of the process for reducing impulsive burst noise in an OFDM signal, performed by receiver 100. Starting at step 200, the received signal is analogue to digital (A/D) converted (step 201). Signal samples are taken regularly and uniformly, to form a series of samples.

In step 202, the presence of the impulse noise is detected. This is based on a sliding window calculation technique, where the combined power of a number of samples is calculated and compared with a reference value. The number of samples within the sliding window should be relatively small, e.g. between 5 and 15 (8 samples is roughly 1 μs in DVB-T). Examples of suitable reference values include the mean power of the previous signal, where the signal level is not expected to change rapidly, e.g. for fixed receivers, or portable receivers undergoing slow movement, or the calculated power from an earlier sliding window. Where the difference between the power within the window and the reference value exceeds a threshold, the presence of the impulse noise is indicated and all the samples within the corresponding sliding window are identified and marked as "under burst".

In step 203, signal samples are selected for blanking. A blanking interval is defined using the position of the burst in the series of samples and its length as indicated by the detection method. The blanking interval is defined to be slightly larger than the burst length, encompassing the samples identified as being affected by the interference, plus a predetermined number of additional samples that immediately precede or follow the corrupted samples, provided that a maximum length for restoration is not exceeded. A maximum length for restoration may be predetermined in order to limit the distortion caused by the blanking process on a resulting signal to an acceptable level.

Figure 3:
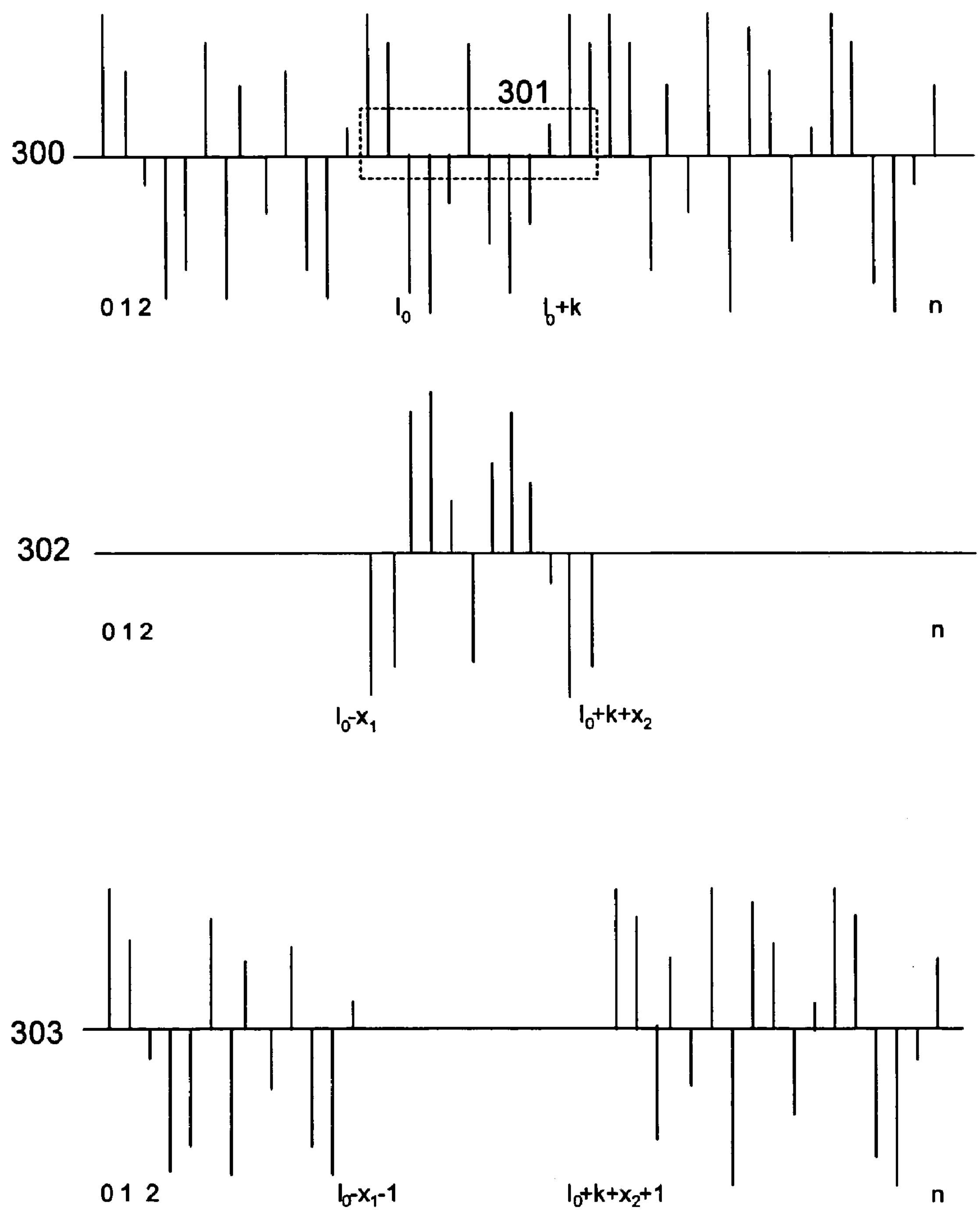
FIG. 3 depicts a time domain signal before and after blanking using a rectangular blanking window.

FIG. 3 depicts an example received signal 300, before blanking, where samples $l_0$ to $(l_0+k)$ have been identified as affected by burst of impulse interference in step 202. The samples selected in step 203 include the corrupted samples $l_0$ to $(l_0+k)$, a first predetermined number $x_1$ of samples preceding the burst and a second predetermined number $x_2$ of samples following the burst. The blanking interval is defined to cover the selected samples $(l_0-x_1)$ to $(l_0+k+x_2)$.

In FIG. 3, both the first and second predetermined numbers $x_1$, $x_2$ are equal to 2. However, where both preceding and following samples are included in the blanking interval, the minimum length of blanking interval, and therefore a corresponding blanking window 301, may be as small as three samples. The number of additional samples to be included in the blanking interval may be defined according to the requirements of the user or service provider. However, as a general indication, in an 8 k DVB-T system, the predetermined number of additional samples may be around 10, and in a 2 k system, around 3.

A plurality of predetermined blanking window lengths is provided and the blanking window 301 is defined to have the smallest of the predetermined lengths that match or exceed the blanking interval $(l_0-x_1)$ to $(l_0+k+x_2)$, i.e. the smallest length that encompasses the samples affected by the burst together with the preceding and following samples (step 204). In this example, the length of the blanking window 301 exactly matches the blanking interval.

Instead of using a plurality of predetermined blanking window lengths, an alternative embodiment of the invention may utilise blanking intervals of a fixed predetermined length, using the detected position of the burst, so that a blanking window covers a fixed number of samples and is positioned so that at least one sample preceding a burst is blanked. This method would not require information on the burst length, as all blanking windows would be defined to have the same length. In a modification of this embodiment, shown in FIG. 4, a plurality of blanking windows 401, 402, 403 of fixed length may be defined and positioned so as to form a composite blanking window 400 covering the required blanking interval $(l_0-x_1)$ to $(l_0+k+x_2)$. The arrows in FIG. 4 indicate the extent of each of the blanking windows 401, 402, 403 in the time domain. As shown, the blanking windows 401, 402, 403 may overlap, if necessary, so that the composite blanking window 400 has the required length.

Alternatively, a more sophisticated blanking technique may be implemented, where both burst position and duration information from the detection method is used to define a blanking interval containing the samples belonging to a detection window identified as being affected by noise, plus a predetermined number of the preceding and following samples, so that the blanking window lengths are fully variable within any predetermined maximum length allowed for restoration.

Figure 5:
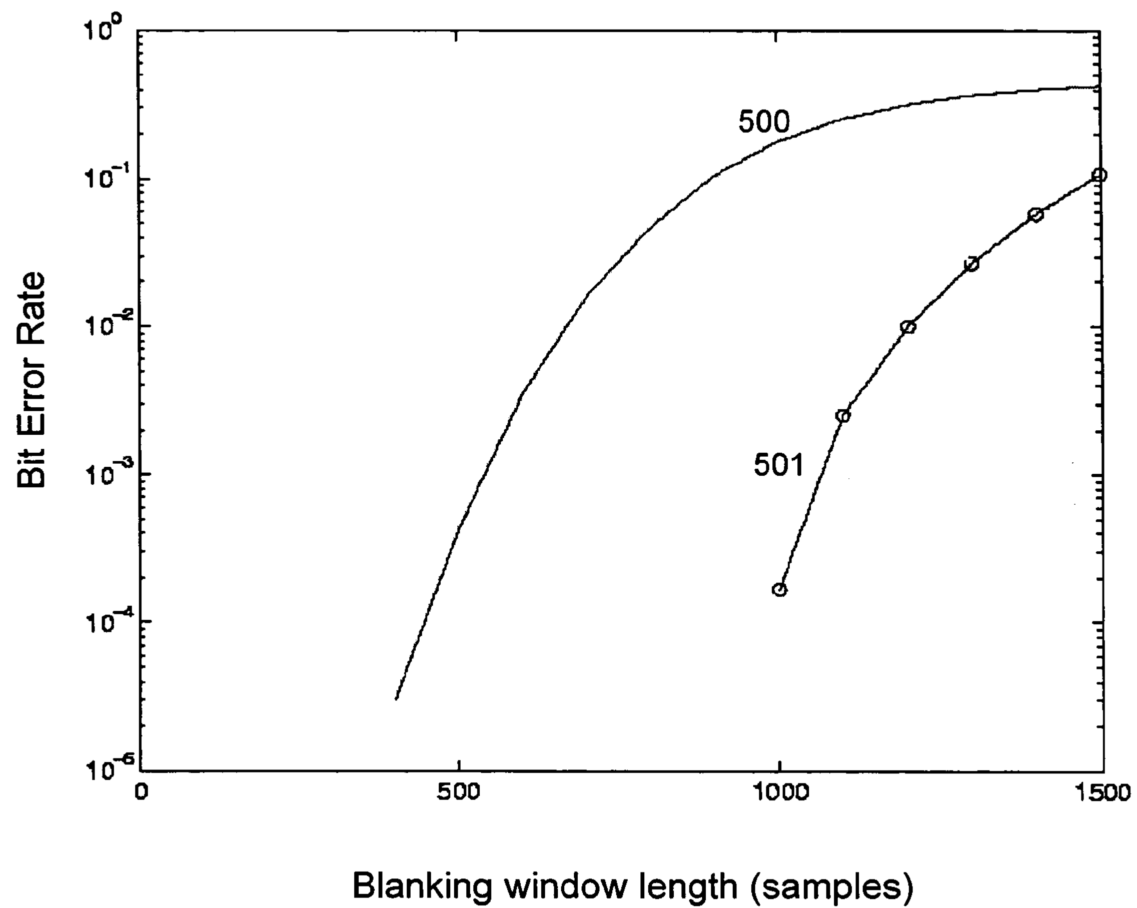
FIG. 5 shows the relationship between a length of a blanking window and bit error rate.

FIG. 5 shows an example relationship between maximum blanking window length and bit error rate (BER) for a simulated 8 k OFDM signal with 16 state Quadrature Amplitude Modulation (16QAM), a code rate of ⅔ signal and a signal to noise ratio of 20 dB. The impulse noise power is 39 dB above the mean signal power. Curve 500 represents the maximum blanking window length for the method of the present invention, whereas curve 501 shows the maximum blanking window length for a method where the blanked samples are subsequently corrected by estimated values of the original signal. Blanking intervals in the range of 1 to 100 or 1 to 500 samples are suitable for all systems. The graph shows that, in an 8 k system, a blanking interval of 500 samples may result in a BER of approximately $6\times10^{-3}$. In the 8 k system, the blanking interval can be up to 1000 samples and, therefore, it is not necessary to employ complicated estimation techniques in order to recover a useable symbol for noise bursts with shorter durations. The maximum blanking window length, i.e. the largest of the predetermined lengths made available for selection, may be defined so as to ensure that the system does not exceed a particular BER.

Generally, there may be several disjoint blanking intervals within one symbol period. In view of this, the blanking procedure can also be subject to a set limit on the number of blanked samples within one OFDM symbol in order to ensure that a minimum proportion of the symbol is left unblanked.

The blanking window 301 is positioned in the time domain so as to cover the selected samples. The samples within the blanking window 301 are blanked (step 205). Referring again to FIG. 3, in one embodiment of the invention, the samples within this interval are blanked by setting their values to zero. This is equivalent to adding a blanking signal 302 to signal 300. As the blanking window 301 is rectangular in form, blanking signal 302 contains corresponding samples of equal but opposite amplitude in the blanking interval $(l_0-x_1)$ to $(l_0+k+x_2)$, the remainder of signal 302 having an amplitude of zero. This addition results in a blanked signal 303, which contains unblanked samples either side of the blanking interval, i.e. samples 0 to $(l_0-x_1-1)$ and $(l_0+k+x_2+1)$ to n corresponding to the received signal a, and a blanking interval of $(k+1+x_1+x_2)$ samples with value zero.

Figure 4:
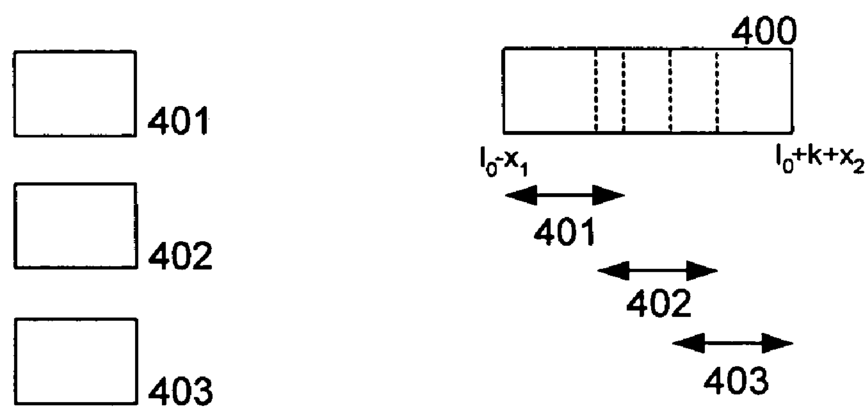
FIG. 4 shows a composite blanking window.
Figure 6A:
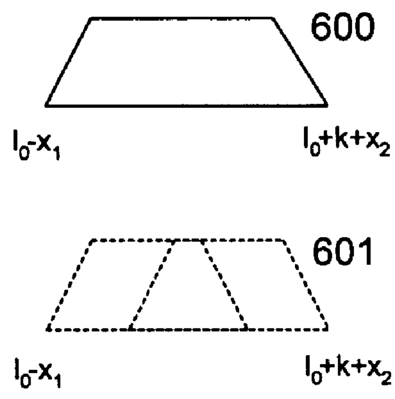
FIG. 6A depicts a first alternative form of blanking window and a corresponding composite blanking window.
Figure 6B:
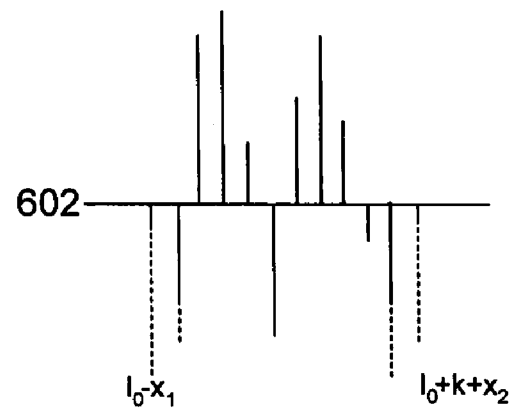
FIG. 6B shows the effect of the blanking window of FIG. 6A on a blanking interval.

While the blanking windows 301, 400-403 shown in FIGS. 3 and 4 are rectangular, the blanking window may be shaped, providing smooth transitions at its ends in order to reduce distortion. FIG. 6A shows an alternative blanking window 600, with linear transitions, together with an equivalent composite blanking window 601 formed from two smaller blanking windows of the same shape. The overlapping regions between the two smaller blanking windows is used to ensure that the selected samples in a main portion of the blanking interval 301, i.e. the samples that are not at the ends, are set to zero, while the amplitudes of the samples at the ends of the blanking interval are the amplitudes of the corresponding sample of the received signal weighted in accordance with the shape of the blanking window 600. An equivalent blanking signal 602 corresponding to the blanking interval 301 is indicated by solid lines in FIG. 6B. The samples at the ends of the blanking interval, which in this example, are the additional samples $(l_0-x_1)$ to $(l_0-1)$ and $(l_0+k+1)$ to $(l_0+k+x_2)$ are not fully blanked. The dotted lines in FIG. 6B indicate the amplitude of the samples at the ends of the blanking window 600 in the blanking signal 302 of FIG. 3, i.e. for a rectangular blanking window.

Figure 7A:
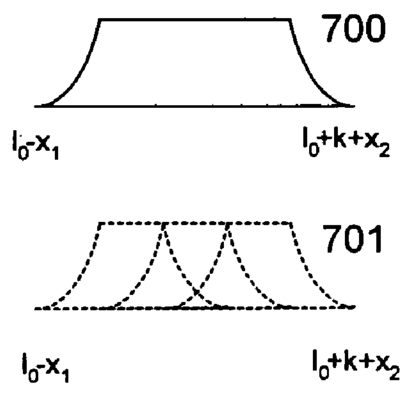
FIG. 7A depicts a second alternative form of blanking window and a corresponding composite blanking window.
Figure 7B:
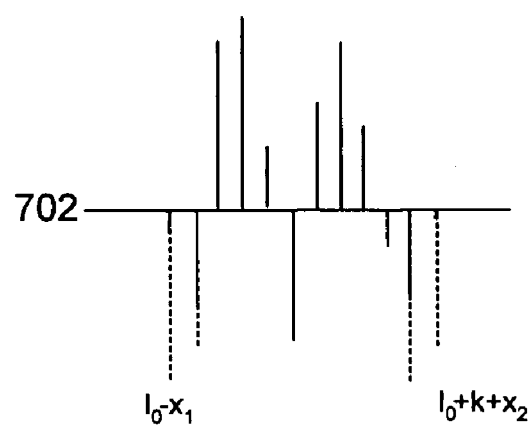
FIG. 7B shows the effect of the blanking window of FIG. 7A on a blanking interval.

FIG. 7A depicts a blanking window 700 with cosine transitions and an equivalent composite blanking window 701 comprising three smaller blanking windows. FIG. 7B illustrates the resulting equivalent blanking signal 702, where the dotted lines indicate the effect of the shape of the blanking window 700 on samples at the ends of the blanking interval.

Where non-rectangular blanking windows 600, 700 are used, the values in the blanking interval 301 of the blanked signal 303 will not be uniformly zero, as the samples at the ends of the blanking interval $(l_0-x_1)$ to $(l_0-1)$ and $(l_0+k+1)$ to $(l_0+k+x_2)$ will retain a weighted fraction of their original amplitude.

In step 206, an estimate of the received signal is derived by calculating a Fast Fourier Transformation (FFT) of the blanked symbol. Due to the blanking, some distortion is present in the blanked symbol. The result of the FFT is then forwarded (step 207) so that the data service is substantially received, having tolerated the interference. The process is then complete (step 208).

Figure 8:
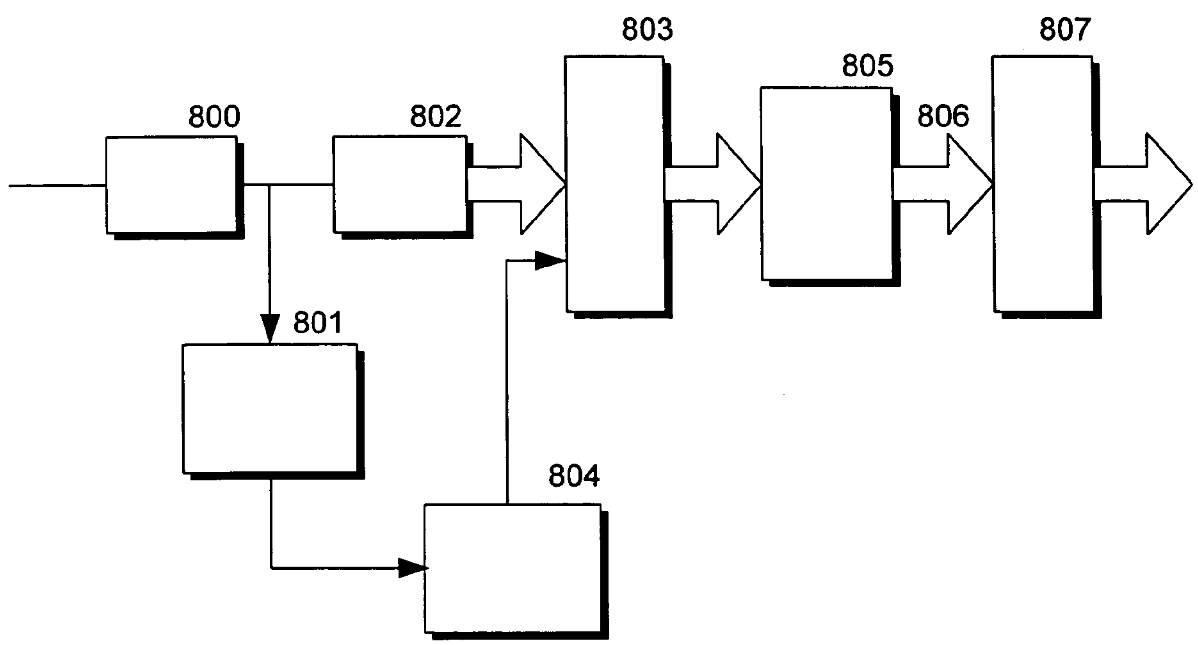
FIG. 8 depicts a receiver for receiving a multi-carrier signal in accordance with an embodiment of the invention.

FIG. 8 is a functional block diagram of a receiver 100 according to the invention. An A/D converter 800 receives and converts the signal. An IQ split may be performed either before or after the A/D conversion. The remaining blocks in FIG. 8 can be substantially divided into three sections: burst detection means, which detect the presence of a burst and determine its position in the time domain and preferably also its length, blanking means and symbol estimation means, including means for performing a FFT of the blanked samples.

A burst detection circuit 801 detects the impulse interference bursts. A serial-to-parallel converter 802 performs demultiplexing of the received data signal. The blanking procedure, step 204, can be performed before serial-to-parallel conversion but is preferably performed subsequently, in an input buffer (IB) 803. A control device 804 controls the IB 803. In one embodiment of the invention, the control device 804 also counts the number of blanked samples within a symbol and monitors whether this number is within the set limit referred to above. This ensures that the distortion arising from the blanking process remains within an acceptable range. A FFT circuit 805 performs the FFT transformation. The result 806 of the FFT of the blanked signal is forwarded and saved in an output buffer (OB) 807.

Figure 9:
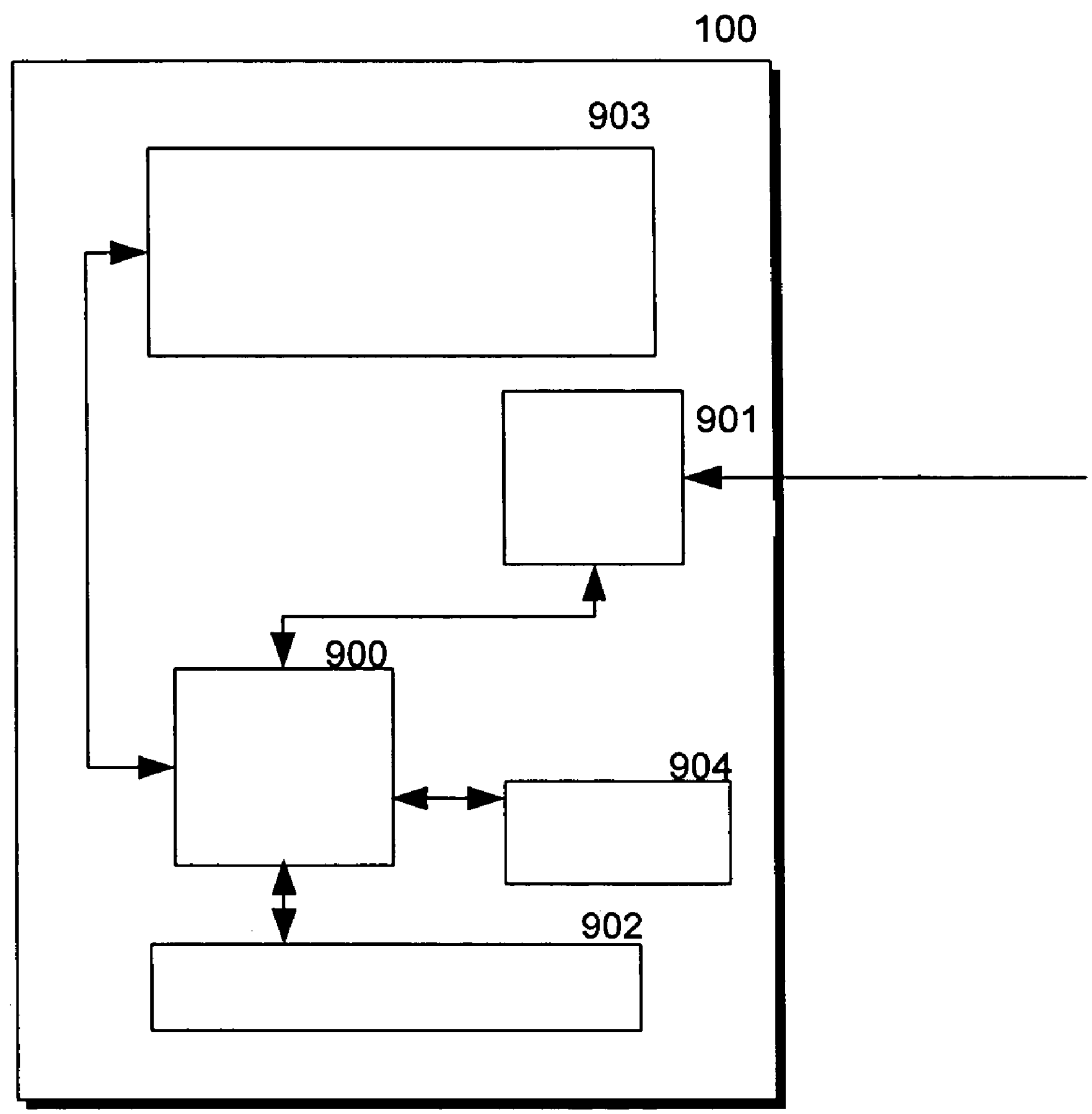
FIG. 9 depicts the hardware components of the receiver of FIG. 8.

FIG. 9 is a block diagram showing the components of the receiver 100. The receiver 100 comprises a processing unit CPU 900, a multi-carrier signal receiver part 901 and a user interface (UI) comprising an input interface, keyboard 902, and an output interface, display 903. In addition, the user interface UI comprises a microphone and a speaker for receiving and producing audio signals (not shown) and may optionally comprise a voice recognition system (not shown). The multi-carrier signal receiver part 901 and the user interface UI 902, 903 and a memory facility 904 are coupled with the processing unit CPU 900. The processing unit CPU 900 comprises a microprocessor (not shown) and software SW (not shown), which is stored in the memory 904. The CPU 900 controls the operation of the receiver 100 on the basis of the software, for the reception of the data stream 102, the removal of impulse burst noise in the received data, display of output in the user interface UI 903 and the reading of inputs received from the user interface UI 902. Alternatively, the invention may be implemented using middleware.

The receiver 100 may be a hand-held device which a user can comfortably carry. Advantageously, the receiver 100 can be a cellular mobile phone which comprises the multi-carrier signal receiver part 901 for receiving the broadcast transmission stream 102 and may interact with service providers.

It is clear to a person skilled in the art that the invention is not restricted to details of the embodiments presented above. For example, the embodiments described above were applied in a DVB-T system. However, the invention is also applicable in other OFDM and other multi-carrier systems, for example transmissions according to the proposed DVB-M standard, forthcoming 4 G services or Terrestrial Integrated Services Digital Broadcasting (ISDB-T, Japanese standard for digital television, terrestrial). The invention is particularly suitable for systems where the number of carriers is high, i.e. greater than, or equal to, a hundred, in which the effects of distortion arising from the blanking process are limited.

The method described in relation to the above embodiment does not include steps for estimating the original signal values of the samples in the blanking interval and using these estimated values to correct the blanked signal, a correction procedure could be performed after the estimation of the blanked signal without departing from the scope of the invention. Suitable methods for estimating the original signal values include those using information from guard bands and/or pilot channels in the received signal, as disclosed in our co-pending applications FI20020387 and PCT/FI02/00551.

The invention may be implemented with an alternative detection method. Suitable methods include identifying signal levels that exceed a predetermined amplitude threshold or monitoring the number of level crossings within a set interval. A sliding window technique could be used in the evaluation of either of these parameters. Alternatively, the detection method could be based on amplitude variations, by calculating the difference between two successive samples, and determining whether the absolute value of the difference exceeds a threshold. Again, a sliding window technique could be used and a burst indicated if the number of variations exceeding the threshold value within the window exceeds a predetermined limit. The detection method may also be based on a combination of any of the discussed detection parameters.

In the embodiment, the blanking interval was defined so as to comprise samples preceding and following a noise burst. However, the blanking interval may be defined to include only those samples affected by noise plus a predetermined number of preceding samples, or to include only the corrupted samples plus a predetermined number of following samples, without departing from the scope of the invention.

Alternatively, the selection of one of a plurality of predetermined blanking lengths could be based on the transmission mode, so that larger windows are used where the modulation and coding are robust and shorter windows where the transmission parameters are more sensitive to interference. Other parameters on which the blanking window length may be based are the coding rate or whether the transmission mode is hierarchical or non-hierarchical. Furthermore, the parameters of any time-interleaving method used in the transmitted signal may influence the selection of a blanking window length.

The receiver 200 could also be configured to limit the number of blanked symbols to a value that is of the order of correction capability. However, depending on the needs of the user or service provider, it may be preferable to blank all the samples where significant impulse burst power is detected even if the correction capability is exceeded.

The invention may be implemented on chip at the receiver device, e.g. in the DVB-T chip at the receiver device. Alternatively, the invention can be implemented at an intermediator intermediating data traffic in the broadcast transmission system, for example, a gateway bridging communication between at least two different network interfaces. Some embodiments of the invention supports portable reception in IP datacast receivers, and can work under severe conditions. Thus, the performance of the embodiments may boost the efficiency and economy of the broadcast services. For example, DVB-T offers an effective and cheap way to distribute data, and the embodiments promote the reception even under severe or noisy conditions.

The invention claimed is:

1. A method for receiving a multi-carrier signal, comprising the steps of:

detecting a presence of at least one impulse interference within the signal, identifying one or more samples of said signal where a significant amount of the impulse noise caused by the at least one impulse interference is present, selecting samples to be blanked, blanking the selected samples to obtain a signal with blanking by applying a blanking window to said signal, wherein the blanking window is a non-rectangular window to provide smooth transitions at its ends, and determining an estimate of the signal with blanking; wherein the selected samples comprise the samples identified to have impulse interference present and further comprise a first predetermined number of samples preceding the identified samples and a second predetermined number of samples following the identified samples.

2. A method according to claim 1, wherein the first predetermined number of samples is equal to the second predetermined number.

3. A method according to claim 1, further comprising: defining a blanking window having a length selected from a plurality of different predetermined lengths and applying the blanking window to the signal so that one or more samples within the blanking window are blanked.

4. A method according to claim 3, wherein the number of blanking windows is one and the predetermined length of the window is equal to or greater than three samples in a time domain.

5. A method according to claim 3, wherein the selected length of the blanking window is the smallest one of the available lengths that is sufficient to encompass the selected samples.

6. A method according to claim 3, wherein the selected blanking window is positioned in relation to the samples in a time domain so that at least one sample preceding the identified samples is within the blanking window.

7. A method according to claim 3, wherein a plurality of instances of the defined blanking window is applied in succession over the samples so that a first blanking window is positioned in relation to the samples in a time domain so that at least one sample preceding the identified samples is within the said first blanking window and at least one second blanking window is positioned so as to include at least one sample immediately succeeding the samples within the first blanking window, wherein all the identified samples are within at least one of the first and second blanking windows.

8. A method according to claim 7, wherein two or more blanking windows are positioned so as to overlap.

9. A computer program comprising program instructions for causing an apparatus to perform the method of claim 1.

10. A communication system comprising a transmitter for transmitting a multi-carrier signal and an apparatus according to claim 9 for receiving said signal.

11. A method according to claim 1, wherein said smooth transitions are linear transitions.

12. A method according to claim 1, wherein said smooth transitions are cosine transitions.

13. An apparatus comprising: a receiver for receiving a multi-carrier signal; and a processor; wherein the processor is configured to: detect the presence of impulse interference in said signal; identify one or more samples of said signal where a significant amount of impulse noise is present; select samples of said signal to be blanked, the selected samples including the identified samples and further including a first predetermined number of samples preceding the identified samples and a second predetermined number of samples following the identified samples, blank the selected samples to obtain a signal with blanking by applying a blanking window to said signal, wherein the blanking window is a non-rectangular window to provide smooth transitions at its ends; and determine an estimate of the signal with blanking.

14. An apparatus according to claim 13, configured to define a blanking window having a length selected from a plurality of different predetermined lengths and to apply the blanking window to the signal so that one or more samples within the blanking window are blanked.

15. An apparatus according to claim 14, configured to select the smallest one of the predetermined lengths that is sufficient to encompass the selected samples.

16. An apparatus according to claim 14, configured to position the selected blanking window in relation to the samples in a time domain so that at least one sample preceding the identified samples is within the blanking window.

17. An apparatus according to claim 14, configured to apply a plurality of instances of the defined blanking window in succession over the samples so that a first blanking window is positioned in relation to the samples in a time domain so that at least one sample preceding the identified samples is within the said first blanking window and at least one second blanking window is positioned so as to include at least one sample immediately succeeding the samples within the first blanking window, wherein all the identified samples are within at least one of the first and second blanking windows.

18. An apparatus according to claim 13, wherein said smooth transitions are cosine transitions.

19. An apparatus according to claim 13, wherein said smooth transitions are linear transitions.

20. An apparatus for receiving a multi-carrier signal comprising: detection means for detecting the presence of impulse interference in the signal and identifying one or more samples of said signal where a significant amount of the impulse noise caused by the impulse interference is present; selection means for selecting samples to be blanked, blanking means for blanking the selected samples to obtain a signal with blanking by applying a blanking window to said signal, wherein the blanking window is a non-rectangular window to provide smooth transitions at its ends; and estimating means for determining an estimate of the signal with blanking; wherein the selection means are configured to select samples being identified to have impulse interference present and further configured to select a first predetermined number of samples preceding the identified samples and a second predetermined number of samples following the identified samples.

21. An apparatus according to claim 20, wherein the blanking means is configured to define a blanking window having a length selected from a plurality of different predetermined lengths and to apply the blanking window to the signal so that one or more samples within the blanking window are blanked.

22. An apparatus according to claim 21, wherein the blanking means is configured to select the smallest one of the predetermined lengths that is sufficient to encompass the selected samples.

23. An apparatus according to claim 21, wherein the blanking means is configured to position the selected blanking window in relation to the samples in a time domain so that at least one sample preceding the identified samples is within the blanking window.

24. An apparatus according to claim 21, wherein the blanking means is configured to apply a plurality of instances of the defined blanking window in succession over the samples so that a first blanking window is positioned in relation to the samples in a time domain so that at least one sample preceding the identified samples is within the said first blanking window and at least one second blanking window is positioned so as to include at least one sample immediately succeeding the samples within the first blanking window, wherein all the identified samples are within at least one of the first and second blanking windows.

25. A communication system comprising a transmitter for transmitting a multi-carrier signal and an apparatus according to claim 20 for receiving said signal.

26. An apparatus according to claim 20, wherein said smooth transitions are linear transitions.

27. An apparatus according to claim 20, wherein said smooth transitions are cosine transitions.

* * * * *